United States Patent
Li

(10) Patent No.: US 10,440,787 B2
(45) Date of Patent: Oct. 8, 2019

(54) LOW-VOLTAGE LIGHT STRIP

(71) Applicant: GUANGDONG OML TECHNOLOGY CO., LTD, Zhongshan, Guangdong (CN)

(72) Inventor: Xiaoping Li, Guangdong (CN)

(73) Assignee: GUANGDONG OML TECHNOLOGY CO., LTD, Zhongshan (CN)

(*) Notice: Subject to any disclaimer, the term of this patent is extended or adjusted under 35 U.S.C. 154(b) by 0 days.

(21) Appl. No.: 16/266,003

(22) Filed: Feb. 2, 2019

(65) Prior Publication Data

US 2019/0246472 A1  Aug. 8, 2019

(30) Foreign Application Priority Data

Feb. 6, 2018  (CN) .................... 2018 2 0201711 U

(51) Int. Cl.
| | |
|---|---|
| *H05B 33/08* | (2006.01) |
| *H01L 33/52* | (2010.01) |
| *H01L 25/13* | (2006.01) |
| *H01L 33/60* | (2010.01) |
| *H01L 33/50* | (2010.01) |
| *H01L 33/48* | (2010.01) |

(52) U.S. Cl.
CPC ......... *H05B 33/0827* (2013.01); *H01L 25/13* (2013.01); *H01L 33/52* (2013.01); *H01L 33/60* (2013.01); *H05B 33/0845* (2013.01); *H01L 33/486* (2013.01); *H01L 33/507* (2013.01)

(58) Field of Classification Search
None
See application file for complete search history.

(56) References Cited

U.S. PATENT DOCUMENTS

| | | | |
|---|---|---|---|
| 2011/0193105 A1* | 8/2011 | Lerman | H01L 25/0753 257/88 |
| 2013/0039050 A1* | 2/2013 | Dau | G02B 6/0045 362/218 |
| 2014/0334137 A1* | 11/2014 | Hasenoehrl | H01L 25/0753 362/147 |

* cited by examiner

*Primary Examiner* — Jany Richardson

(57) ABSTRACT

The present invention discloses a low-voltage light strip including a light strip body, a light-emitting unit and a flexible protective sleeve; wherein, each light-emitting unit includes a constant current circuit and an LED light string, the LED light string including an LED light bead; the LED light bead includes an LED chip, an encapsulant, and a first optical layer arranged between the encapsulant and the LED chip; a surface of the flexible protective sleeve is provided with a second optical layer. By providing the constant current circuit, the invention achieves a uniform head and tail brightness as well as an ultra-long connection of the low-voltage light strip. Total reflection of light is also avoided by an arrangement of a first and a second optical layers, thereby improving the light-emitting efficiency.

9 Claims, 2 Drawing Sheets

LOW-VOLTAGE LIGHT STRIP

CROSS-REFERENCE TO RELATED APPLICATIONS

The present application claims the benefit of Chinese Utility Model Application No. 201820201711.9 filed on Feb. 6, 2018, the entire contents of which are hereby incorporated by reference.

FIELD OF THE INVENTION

The present invention relates to LED field, in particular a low-voltage light strip.

BACKGROUND OF THE INVENTION

An LED light strip refers to the assembly of LED lights on a strip-shaped FPC (flexible printed circuit) or PCB hard board, and is named strip as resembling a tape in shape. LED light strip has gradually emerged in various decoration industries as being credited for its long service life (a normal life of 80,000 to 100,000 hours), energy-efficiency and environmentally friendliness.

LED light strips mainly include high-voltage light strips and low-voltage light strips. The high-voltage light strip is directly connected to 220V mains power, and suffers severe light attenuation and instability due to instability of the mains power. The low-voltage lamp is generally 12V or 24V with unstable voltage drop, wherein a considerable head-tail voltage difference exists when under single-ended power supply; a significant difference in head and tail brightness and extremely poor uniformity in light emission also exist when under service voltage, thereby causing a continuous decrease in brightness as the length of the light strip increases. As a result, the usability of existing commercial low-voltage light strips are heavily affected by limitation of length, which in this case limits a connection length (<5 meters) and a length of head-tail power supply (<10 meters), thereby failing to meet the demands of users.

On the other hand, existing LED chips are made of gallium nitride with a refractive index of 2.2 or higher, while the refractive index of the encapsulants used for packaging is usually 1.4-1.5. Encapsulants with high refractive index are commonly used for packaging in order to reduce light loss, a problem yet to be solved as the difference between the refractive indexes of the encapsulant and LED chip still remains large. Further light loss also occurs when light is refracted from the encapsulanet into the air as the difference in refractive index also exists for the two. As a result, light-emitting efficiency of LED light strip is considerably impaired.

Therefore, the development of an ultra-long, low-voltage light strip with high light-emitting efficiency and uniform illumination has become an urgent need in the LED field.

SUMMARY OF THE INVENTION

The present invention aims to solve the above problem in LED field by providing an ultra-long, low-voltage light strip with high light-emitting efficiency and uniform illumination.

In order to solve the problem, the present invention provides a low-voltage light strip, comprising a light strip body, at least one set of light-emitting units packaged on the light strip body, and a flexible protective sleeve arranged on an outer side of the light strip body and the light-emitting units; wherein: each of the light-emitting units comprises a constant current circuit and an LED light string, an input end of the constant current circuit being connected to a power source, and an output end of the constant current circuit being connected to the LED light string; the LED light string comprises at least one LED light bead, which includes an LED chip, an encapsulant encapsulating the LED chip, and a first optical layer arranged between the encapsulant and the LED chip; the first optical layer covers a surface of the LED chip, a refractive index thereof being between a refractive index of the LED chip and a refractive index of the encapsulant; and, a surface of the flexible protective sleeve is provided with a second optical layer, a refractive index of the second optical layer being between the refractive index of the flexible protective sleeve and a refractive index of air.

Preferably, the constant current circuit comprises a first resistor group, a second resistor group, a first triode, and a second triode; wherein: an emitter of the first triode is connected to an end of the first resistor group, a collector of the first triode is connected to an end of the LED light string, and a base of the first triode is connected to another end of the LED light string via the second resistor group; and, an emitter of the second triode is connected to another end of the first resistor group, a base of the second triode is connected to an end of the first resistor group, and a collector of the second triode is connected to the base the first triode.

Preferably, the constant current circuit comprises the first resistor group, the second resistor group, a first NPN triode, and a second NPN triode; wherein: an emitter of the first NPN triode is grounded via the first resistor group, a collector of the first NPN triode is connected to the power source via the LED light string, and a base of the first NPN triode is connected to the power supply via the second resistor group; and, an emitter of the second NPN triode is grounded, a base of the second NPN triode is grounded via the first resistor group, and a collector of the second NPN triode is connected to the power source via the second resistor group.

Preferably, the constant current circuit comprises the first resistor group, the second resistor group, a first PNP triode, and a second PNP triode; wherein: an emitter of the first PNP triode is connected to the power source via the first resistor group, a collector of the first PNP triode is grounded via the LED light string, and a base of the first PNP triode is grounded through via second resistor group; and an emitter of the second PNP triode is connected to the power source, a base of the second PNP triode is connected to the power source via the first resistor group, and a collector of the second PNP triode is grounded via the second resistor group.

Preferably, the first resistor group and the second resistor group comprises at least one resistor.

Preferably, the first optical layer is a transparent ceramic film having a refractive index of 1.6 to 2.0.

Preferably, the transparent ceramic film is a transparent aluminum oxide film or a transparent aluminum nitride film.

Preferably, the flexible protective sleeve and the encapsulant are connected with each other to form an integral structure, and the flexible protective sleeve has a refractive index lower than the refractive index of the encapsulant; and, the flexible protective sleeve is made of epoxy resin, polyurethane, organosilicon, acrylic resin or polyester.

Preferably, the second optical layer has a refractive index of 1.2 to 1.4, and the second optical layer is one or both of lithium fluoride and magnesium fluoride.

Preferably, the low-voltage light strip has a length of at least 10 meters.

The present invention has the following advantages:

1. The invention provides a constant current circuit with simple structure in a low-voltage light strip and achieves constant current power supply for an LED light string, thereby advantageously ensuring the consistency of the current through the LED light string in each light-emission unit, and thus maintaining the uniformity of head and tail brightness. Meanwhile, each light-emitting unit the present invention has same brightness under the effect of the constant current circuit, thereby allowing a user to set one or more light-emitting units or LED light strings based on needs in a flexible manner, and allowing the manufacturing of an ultra-long, low-voltage light strip with strong adaptability.

2. In the low-voltage light strip provided by the present invention, the light emitted by the LED chip sequentially passes through the first optical layer having a refractive index of 1.6-2.0, the encapsulant having a refractive index of about 1.5, the flexible protective sleeve having a refractive index of 1.4, and the second optical layer having a refractive index of 1.2-1.4. Namely, the refractive indexes of the media through which the light passes reduce gradually, thereby avoiding a total reflection of the light, and improving the light emission efficiency of the low-voltage light strip. On the other hand, since the emitted light is refracted from a medium having a higher refractive index to a medium having a lower refractive index, the angle of exit of the light increases during its emission through these different media, thereby increasing the uniformity of light emission.

3. A transparent ceramic film having a refractive index between the refractive indexes of the LED chip and the encapsulant is arranged on the surface of the LED chip, thereby greatly improving the light emission efficiency of the LED chip. Secondly, given the advantage of a good compactness of the transparent ceramic film, a dense optical layer is formed between the LED chip and the encapsulant to prevent external moisture from entering an interior of the LED bead, thereby prolonging the service life of the LED chip and the LED bead. Furthermore, since the heat dissipation efficiency of the transparent ceramic film is advantageously high, heat accumulation is prevented as the light emitted by the LED chip is rapidly diffused to surrounding areas through the transparent ceramic film, thereby further prolonging the service life of the LED chip.

LIST OF REFERENCE NUMERALS

Figure 1:
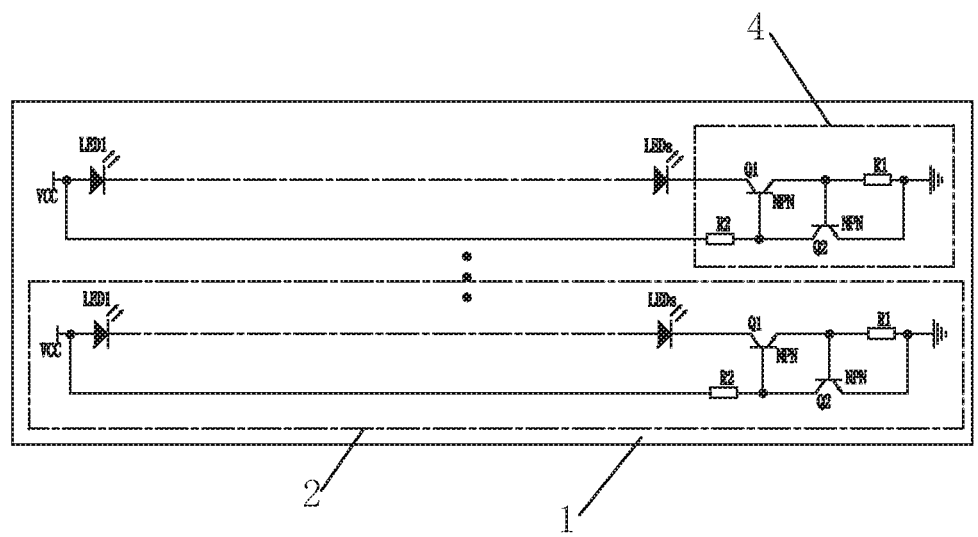
FIG. 1 is a schematic structural view of a first embodiment of a low-voltage light strip of the present invention.

1. Light strip body
2. Light-emitting unit
21. LED chip
22. Encapsulant
2a. LED light bead
23. First optical layer
3. Flexible protective sleeve
31. Second optical layer
4. Constant current circuit
R1. First resistor group
R2. Second resistor group
Q1. First NPN triode or first PNP triode
Q2. Second NPN triode or second PNP triode

DETAILED DESCRIPTION OF ILLUSTRATED EMBODIMENTS

The present invention will be further described in conjunction with the drawings for a purpose of clarifying the goals, technical solutions and advantages thereof. In this regard, the terms "up/upper/above", "low/lower/beneath", "left", "right", "front", "rear/back", "inside/inner side", "outside/outer side" and the like used herein are only based on the drawings with no attempt to limit the scope of the present invention.

FIGS. 1-4 show a specific structure of a low-voltage light strip of the present invention, which includes a light strip body 1, at least one set of light-emitting units 2 packaged on the strip body 1, and a flexible protective sleeve 3 arranged on an outer side of the light strip body 1 and the light-emitting units 2.

Each of the light-emitting units 2 includes a constant current circuit 4 and an LED light string, an input end of the constant current circuit 4 being connected to a power source, and an output end of the constant current circuit 4 being connected to the LED light string.

The LED light string comprises at least one LED light bead 2a, which includes an LED chip 21, an encapsulant 22 encapsulating the LED chip 21, and a first optical layer 23 arranged between the encapsulant 22 and the LED chip 21.

The first optical layer 23 covers a surface of the LED chip 21, a refractive index thereof being between a refractive index of the LED chip 21 and a refractive index of the encapsulant 22.

A surface of the flexible protective sleeve 3 is provided with a second optical layer 31, a refractive index of the second optical layer 31 being between a refractive index of the flexible protective sleeve 3 and a refractive index of air.

The light strip body 1 constitutes a main structure of the low-voltage light strip, and is provided with a light-emitting unit mounting position for mounting the light-emitting unit.

The light-emitting unit 2 is configured to provide a light source with stable and uniform light emission. Each light-emitting unit 2 is independent of each other, thereby allowing a user to set one or more light-emitting units 2 based on needs. The light-emitting units 2 are sequentially arranged on the light strip body 1 to form a strip structure. The light-emitting unit 2 includes a constant current circuit 4 and an LED light string, an input end of the constant current circuit 4 being connected to a power source, and an output end of the constant current circuit 4 being connected to the LED light string.

The present invention provides a constant current circuit 4 in the low-voltage light strip and achieves constant current power supply for an LED light string, thereby advantageously ensuring the consistency of the current through the LED light string in each light-emission unit 2, and thus maintaining the uniformity of head and tail brightness.

Specifically, the constant current circuit 4 includes a first resistor group, a second resistor group, a first triode, and a second triode. An emitter of the first triode is connected to an end of the first resistor group, a collector of the first triode is connected to an end of the LED light string, and a base of the first triode is connected to another end of the LED light string via the second resistor group. An emitter of the second triode is connected to another end of the first resistor group, a base of the second triode is connected to the end of the first resistor group, and a collector of the second triode is connected to the base of the first triode.

After being electrified, the constant current circuit outputs a constant current under an interaction of the first resistor group, the second resistor group, the first triode and the second triode, thereby achieving constant current supply for the LED string. The above configuration advantageously ensures the consistency of the current through the LED light string in each light-emission unit, and thus maintaining the uniformity of head and tail brightness. The first resistor group and the second resistor group include at least one resistor, namely, in a flexible manner, the first resistor group and the second resistor group can include one or a plurality of resistors connected in series and/or in parallel with each other.

FIG. 1 shows a first embodiment of the low-voltage light strip of the present invention. The constant current circuit 4 includes a first resistor group, a second resistor group, a first NPN triode Q1, and a second NPN triode Q2. An emitter of the first NPN triode Q1 is grounded via the first resistor group, a collector of the first NPN triode Q1 is connected to a power source via the LED string, and a base of the first NPN triode Q1 is connected to the power source via the second resistor. An emitter of the second NPN triode Q2 is grounded, a base of the second NPN triode Q2 is grounded via the first resistor group, and a collector of the second NPN triode Q2 is connected to the power source via the second resistor group.

After being electrified, the first NPN triode Q1 is powered up first with the LED string lightened. As the current Ic through the collector of the first NPN triode Q1 increases, current flows through the first resistor group R1. The second NPN triode Q2 is powered up when a voltage U of 0.7V (U=R1×Ic=0.7V) on the first resistor group R1 is reached. Subsequently, the base voltage of the first NPN triode Q1 is driven down, while both the first NPN triode Q1 and the second NPN triode Q2 are cut off (the second NPN triode Q2 being cut off due to loss of voltage on the first resistor group R1 as the first NPN triode Q1 was cut off), which is then followed by an increase in the base voltage of the first NPN triode Q1, so that the branch current through the LED light string is maintained as I=0.7/R1. Correspondingly, the constant current value of the output of the constant current circuit can be adjusted by altering the configuration of the first resistor group R1 and the second resistor group R2.

Figure 2:
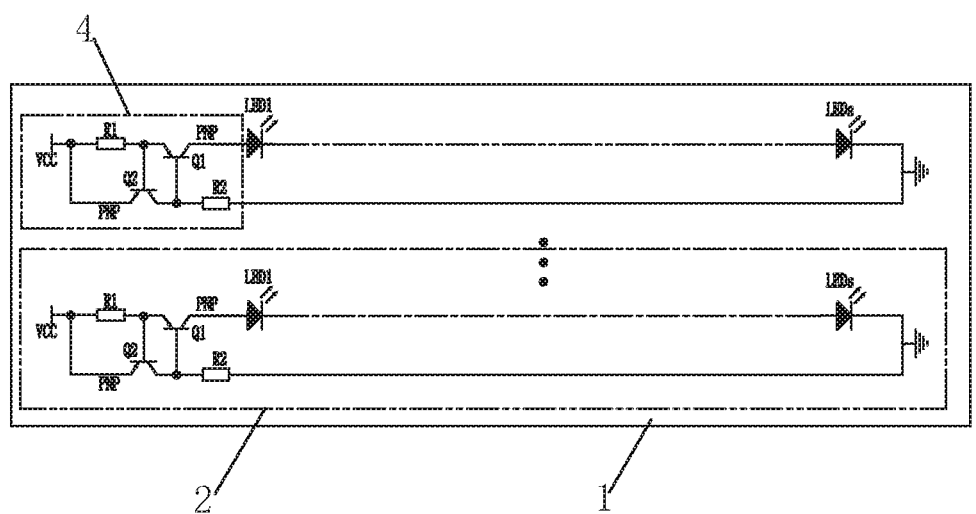
FIG. 2 is a schematic structural view of a second embodiment of a low-voltage light strip of the present invention.

FIG. 2 shows a second embodiment of the low-voltage light strip of the present invention. In contrast to the first embodiment described in FIG. 1, the constant current circuit 4 of the present embodiment includes a first resistor group, a second resistor group, a first PNP triode Q1 and a second PNP triode Q2. An emitter of the first PNP triode Q1 is connected to a power source via the first resistor group, a collector of the first PNP triode Q1 is grounded via the LED light string, and a base of the first PNP triode Q1 is grounded via the second resistor group. An emitter of the second PNP triode Q2 is connected to the power source, a base of the second PNP triode Q2 is connected to the power source via the first resistor group, and a collector of the second PNP triode Q2 is grounded via the second resistor group.

After being electrified, the first PNP triode Q1 is powered up first with the LED string lightened. As the current Ic through the collector of the first PNP triode Q1 increases, current flows through the first resistor group R1. The second PNP triode Q2 is powered up when a voltage U of 0.7V (U=R1×Ic=0.7V) on the first resistor group R1 is reached. Subsequently, the base voltage of the first PNP triode Q1 is driven down, while both the first PNP triode Q1 and the second PNP triode Q2 are cut off (the second PNP triode Q2 being cut off due to loss of voltage on the first resistor group R1 as the first PNP triode Q1 was cut off), which is then followed by an increase in the base voltage of the first PNP triode Q1, so that the branch current through the LED light string is maintained as I=0.7/R1. Correspondingly, the constant current value of the output of the constant current circuit can be adjusted by altering the configuration of the first resistor group R1 and the second resistor group R2.

It is to be noted that, each light-emitting unit 2 of the present invention is independent of each other with same brightness under the effect of the constant current circuit, thereby allowing a user to set one or more light-emitting units 2 based on needs, and allowing an ultra-long connection. Preferably, the low-voltage light strip has a length of at least 10 meters (the length exceeds 10 meters when under single-ended power supply).

From the above, the present invention provides the constant current circuit 4 with simple structure in the low-voltage light strip and achieves constant current power supply for an LED light string, thereby advantageously ensuring the consistency of the current through the LED light string in each light-emission unit 2, and thus maintaining the uniformity of head and tail brightness. This also allows the manufacturing of an ultra-long, low-voltage light strip.

Figure 3:
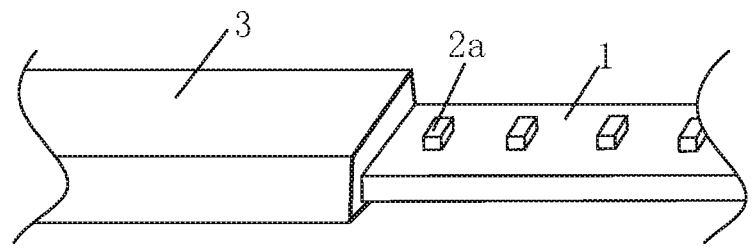
FIG. 3 is a perspective view of a low-voltage light strip of the present invention.
Figure 4:
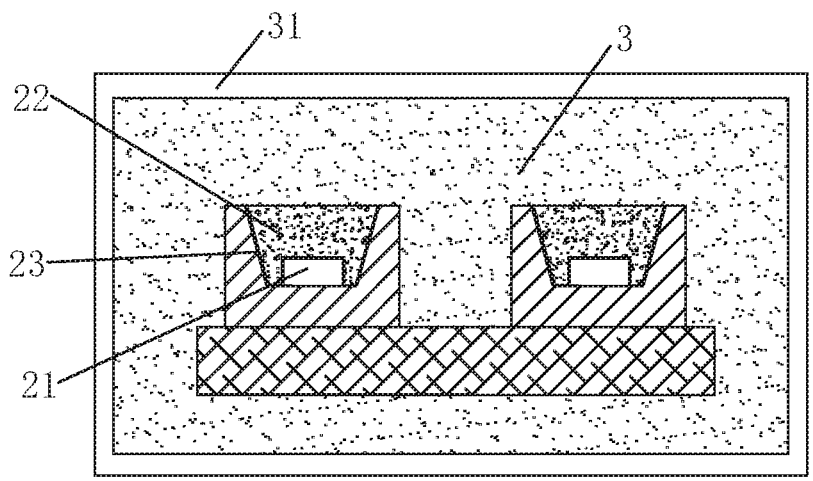
FIG. 4 is a schematic cross-sectional view of a low-voltage light strip of the present invention.

Correspondingly, as shown in FIGS. 3-4, the LED light string includes at least one LED light bead 2a, which allows a user to set one or a plurality of LED light beads 2a in series based on needs in a flexible manner.

The LED light bead 2a includes at least one LED chip 21, an encapsulant 22 encapsulating the LED chip 21, and a first optical layer 23 arranged between the encapsulant 22 and the LED chip 21. Such a configuration allows a user to select a single-core, two-core or three-core LED light bead (i.e. LED light bead with one, two and three LED chips respectively) based on needs.

The encapsulant 22 covers and encapsulates all the LED chips 21 therein for a purpose of protection, and improvement of light emission efficiency of the LED light beads 2a. Specifically, the encapsulant 22 contains a transparent colloid and a phosphor mixed therein, the transparent colloid being an epoxy resin or a silica gel, and the phosphor being a yellow phosphor.

It should be noted that, a current LED chip is generally made of gallium nitride and thus has a corresponding refractive index of about 2.2. Therefore, the path of light emitted by a commonly mounted LED chip sequentially passed through the gallium nitride, the encapsulant, the flexible protective sleeve and air. Despite a material with a high refractive index is generally adopted, the commonly used encapsulant remains a refractive index of about 1.5, which still causes a large gap between the refractive indexes of the LED chip and the encapsulant. Such a gap in refractive index results in total reflection of the light emitted by the LED chip (i.e., the light is trapped inside the LED chip), thereby impairing the light emission effect.

In order to solve the above technical problem, the present invention provides a first optical layer 23 on a surface of the LED chip 21, a refractive index of the first optical layer 23 being between the refractive index of the LED chip 21 and the refractive index of the encapsulant 22. Specifically, the first optical layer 23 is a transparent ceramic film having a refractive index of 1.6-2.0, specifically 1.7, 1.8 or 1.9. In this embodiment, the transparent ceramic film is a transparent aluminum oxide film or a transparent aluminum nitride film.

A transparent ceramic film having a refractive index between the refractive indexes of the LED chip 21 and the encapsulant 22 is arranged on the surface of the LED chip 21, thereby greatly improving the light emission efficiency of the LED chip 21. Secondly, given the advantage of a good compactness of the transparent ceramic film, a dense optical layer is formed between the LED chip 21 and the encapsulant 22 to prevent external moisture from entering an interior of the LED bead 2a, thereby prolonging the service life of the LED chip 21 and the LED bead 2a. Furthermore, since the heat dissipation efficiency of the transparent ceramic film is advantageously high, heat accumulation is prevented as the light emitted by the LED chip 21 is rapidly diffused to surrounding areas through the transparent ceramic film, thereby further prolonging the service life of the LED chip 21.

The flexible protective sleeve 3 is wrapped around the light body 1 and the light-emitting unit 2 to prevent external moisture and the like from entering an interior of the flexible protective sleeve 3, thereby prolonging the service life of the low-voltage light strip. The flexible protective sleeve 3 is made of plastics, specifically epoxy resin, polyurethane, organosilicon, acrylic resin or polyester. In this embodiment, the flexible protective sleeve 3 and the encapsulant 22 are connected with each other to form an integral structure in order to reduce light loss. Also, the refractive index of the flexible protective sleeve 3 is lower than that of the encapsulant 22 to further reduce light loss between the flexible protective sleeve 3 and the encapsulant 22.

In this embodiment, the flexible protective sleeve 3 is made of a transparent silica gel having a low refractive index of 1.4. Since the refractive index of air is 1, a large gap also exists between the refractive indexes of the flexible protective sleeve and the air, which also contributes to impairing the light emission efficiency of the light strip. To solve this technical problem, the surface of the flexible protective sleeve 3 is provided with a second optical layer 31, a refractive index thereof being between the refractive indexes of the flexible protective sleeve 3 and the air. Such a configuration increases the light transmittance of the low voltage strip.

Specifically, the second optical layer 31 has a refractive index of 1.2-1.4, and is one or both of lithium fluoride and magnesium fluoride. In this embodiment, the second optical layer 31 is lithium fluoride with a refractive index of 1.3.

In the low-voltage light strip provided by the present invention, the light emitted by the LED chip sequentially passes through the first optical layer 23 having a refractive index of 1.6-2.0, the encapsulant 22 having a refractive index of about 1.5, the flexible protective sleeve 3 having a refractive index of 1.4, and the second optical layer 31 having a refractive index of 1.2-1.4. Namely, the refractive indexes of the media through which the light passes reduce gradually, thereby avoiding a total reflection of the light, and improving the light emission efficiency of the low-voltage light strip. On the other hand, since the emitted light is refracted from a medium having a higher refractive index to a medium having a lower refractive index, the angle of exit of the light increases during its emission through these different media, thereby increasing the uniformity of light emission.

The above are only preferred embodiments of the present invention. It is to be noted that various improvements and modifications are also both conceivable and achievable for those skilled in the art without departing from the principle of the invention, and these improvements and modifications shall also be within the scope of the present invention.

The invention claimed is:

1. A low-voltage light strip, comprising a light strip body, at least one set of light-emitting units packaged on the light strip body, and a flexible protective sleeve arranged on an outer side of the light strip body and the light-emitting units; wherein
each of the light-emitting units comprises a constant current circuit and an LED light string, an input end of the constant current circuit being connected to a power source, and an output end of the constant current circuit being connected to the LED light string;
the LED light string comprises at least one LED light bead, which comprises an LED chip, an encapsulant encapsulating the LED chip, and a first optical layer arranged between the encapsulant and the LED chip;
the first optical layer covers a surface of the LED chip, a refractive index thereof being between a refractive index of the LED chip and a refractive index of the encapsulant; and
a surface of the flexible protective sleeve is provided with a second optical layer, a refractive index of the second optical layer being between a refractive index of the flexible protective sleeve and a refractive index of air.

2. The low-voltage light strip of claim 1, wherein the constant current circuit comprises a first resistor group, a second resistor group, a first triode, and a second triode; wherein
an emitter of the first triode is connected to an end of the first resistor group, a collector of the first triode is connected to an end of the LED light string, and a base of the first triode is connected to another end of the LED light string via the second resistor group; and
an emitter of the second triode is connected to another end of the first resistor group, a base of the second triode is connected to an end of the first resistor group, and a collector of the second triode is connected to the base of the first triode.

3. The low-voltage light strip of claim 2, wherein the first triode and the second triode are NPN triodes; wherein:
an emitter of the first NPN triode is grounded via the first resistor group, a collector of the first NPN triode is connected to the power source via the LED light string, and a base of the first NPN triode is connected to the power supply via the second resistor group; and
an emitter of the second NPN triode is grounded, a base of the second NPN triode is grounded via the first resistor group, and a collector of the second NPN triode is connected to the power source via the second resistor group.

4. The low-voltage light strip of claim 2, wherein the first triode and the second triode are PNP triodes; wherein:
an emitter of the first PNP triode is connected to the power source via the first resistor group, a collector of the first PNP triode is grounded via the LED light string, and a base of the first PNP triode is grounded through via second resistor group; and
an emitter of the second PNP triode is connected to the power source, a base of the second PNP triode is connected to the power source via the first resistor group, and a collector of the second PNP triode is grounded via the second resistor group.

5. The low-voltage light strip of claim 2, wherein the first resistor group and the second resistor group comprises at least one resistor.

6. The low-voltage light strip of claim 1, wherein the first optical layer is a transparent ceramic film having a refractive index of 1.6 to 2.0.

7. The low-voltage light strip of claim 6, wherein the transparent ceramic film is a transparent aluminum oxide film or a transparent aluminum nitride film.

8. The low-voltage light strip of claim 1, wherein the flexible protective sleeve and the encapsulant are connected with each other to form an integral structure, the flexible protective sleeve has a refractive index lower than the refractive index of the encapsulant; and the flexible protective sleeve is made of epoxy resin, polyurethane, organosilicon, acrylic resin or polyester.

9. The low-voltage light strip of claim 1, wherein the second optical layer has a refractive index of 1.2 to 1.4, and the second optical layer is one or both of lithium fluoride and magnesium fluoride.

* * * * *